(12) United States Patent
Cho et al.

(10) Patent No.: US 11,302,404 B2
(45) Date of Patent: Apr. 12, 2022

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventors: Sung Hoon Cho, Icheon-si (KR); Jae Sung Sim, Icheon-si (KR); Han Soo Joo, Icheon-si (KR); Hee Chang Chae, Icheon-si (KR); Se Kyoung Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 69 days.

(21) Appl. No.: 16/923,635

(22) Filed: Jul. 8, 2020

(65) Prior Publication Data

US 2021/0241838 A1 Aug. 5, 2021

(30) Foreign Application Priority Data

Feb. 5, 2020 (KR) .......................... 10-2020-0013895

(51) Int. Cl.
*G11C 16/26* (2006.01)
*G11C 16/34* (2006.01)
*G11C 16/04* (2006.01)

(52) U.S. Cl.
CPC ...... *G11C 16/3427* (2013.01); *G11C 16/0483* (2013.01); *G11C 16/26* (2013.01)

(58) Field of Classification Search
CPC ...................................................... G11C 16/26
USPC .................................................... 365/185.12
See application file for complete search history.

(56) References Cited

U.S. PATENT DOCUMENTS

2020/0133574 A1* 4/2020 Lee .................... G11C 16/26

FOREIGN PATENT DOCUMENTS

KR  1020150034552 A  4/2015
KR  1020160136675 A  11/2016

* cited by examiner

*Primary Examiner* — Jason Lappas
(74) *Attorney, Agent, or Firm* — William Park & Associates Ltd.

(57) ABSTRACT

Provided herein may be a semiconductor memory device and a method of operating the semiconductor memory device. The semiconductor memory device may include: a memory block including upper pages, a center page, and lower pages; a peripheral circuit configured to perform a read operation on the memory block; and a control logic configured to control the peripheral circuit to perform the read operation and control the peripheral circuit such that, during the read operation, based on a location of a selected page among the plurality of pages, a pass voltage to be applied to first adjacent pages disposed adjacent to the selected page in a first direction differs from a pass voltage to be applied to second adjacent pages disposed adjacent to the selected page in a second direction.

20 Claims, 14 Drawing Sheets

FIG. 7

| SSL | WL0 | WL1 | ... | WLc | ... | Sel WL-2 | Sel WL-1 | Sel WL | Sel WL+1 | Sel WL+2 | ... | WLn | DSL |
|---|---|---|---|---|---|---|---|---|---|---|---|---|---|
| 0V (off) | Vpass | Vpass | Vpass | Vpass | Vpass | Vpass_off2 | Vpass_off2 | Vread | Vpass_off1 | Vpass_off1 | Vpass | Vpass | 0V (off) |

FIG. 9

| SSL | WL0 | ... | Sel WL-2 | Sel WL-1 | Sel WL | Sel WL+1 | Sel WL+2 | ... | WLc | ... | WLn-1 | WLn | DSL |
|---|---|---|---|---|---|---|---|---|---|---|---|---|---|
| 0V (off) | Vpass | Vpass | Vpass_off1 | Vpass_off1 | Vread | Vpass_off2 | Vpass_off2 | Vpass | Vpass | Vpass | Vpass | Vpass | 0V (off) |

FIG. 11

| SSL | WL0 | ... | Sel WL-3 | Sel WL-2 | Sel WL-1 | Sel WL (WLc) | Sel WL+1 | Sel WL+2 | Sel WL+3 | ... | WLn | DSL |
|---|---|---|---|---|---|---|---|---|---|---|---|---|
| 0V (off) | Vpass | Vpass | Vpass | Vpass | Vpass | Vread | Vpass | Vpass | Vpass | Vpass | Vpass | 0V (off) |

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2020-0013895, filed on Feb. 5, 2020, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Semiconductor devices, in particular, semiconductor memory devices are classified into volatile memory devices and nonvolatile memory devices.

Although read and write speeds are comparatively low, the nonvolatile memory device can retain data stored therein even when power supply is interrupted. Therefore, the nonvolatile memory device is used when there is the need for storing data which must be maintained regardless of supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

The flash memory has both advantages of RAM in which data is programmable and erasable and advantages of ROM in which data store therein can be retained even when power is interrupted. Such a flash memory is widely used as a storage medium of portable electronic devices such as a digital camera, a personal digital assistant (PDA) and MP3.

Flash memory devices may be classified into a two-dimensional semiconductor device in which memory cell strings are horizontally formed on a semiconductor substrate, and a three-dimensional semiconductor device in which memory cell strings are vertically formed on a semiconductor substrate.

The three-dimensional semiconductor device is a memory device which is devised to overcome a limitation in the degree of integration of the two-dimensional semiconductor device and includes a plurality of memory cell strings which are vertically formed on a semiconductor substrate. Each memory cell string may include a drain select transistor, a plurality of memory cells, and a source select transistor, which are connected in series between a bit line and a source line.

SUMMARY

An embodiment of the present disclosure may provide for a semiconductor memory device including: a memory block including upper pages, a center page, and lower pages; a peripheral circuit configured to perform a read operation on the memory block; and a control logic configured to control the peripheral circuit to perform the read operation and control the peripheral circuit such that, during the read operation, based on a location of a selected page among the plurality of pages, a pass voltage to be applied to first adjacent pages disposed adjacent to the selected page in a first direction differs from a pass voltage to be applied to second adjacent pages disposed adjacent to the selected page in a second direction.

An embodiment of the present disclosure may provide for a semiconductor memory device including: a memory block including a plurality of pages; a peripheral circuit configured to perform a read operation on the memory block; and a control logic configured to control the peripheral circuit to perform the read operation. During the read operation, when a selected page of the plurality of pages corresponds to an upper end of a memory cell string, the control logic may set, to a first offset pass voltage, a pass voltage to be applied to first adjacent pages disposed adjacent to the selected page in a first direction, and set, to a second offset pass voltage higher than the first offset pass voltage, a pass voltage to be applied to second adjacent pages disposed adjacent to the selected page in a second direction.

An embodiment of the present disclosure may provide for a method of operating a semiconductor memory device, including: setting a first pass voltage corresponding to first adjacent pages disposed adjacent to a selected page in a first direction during a read operation on a memory block including a plurality of pages; setting a second pass voltage corresponding to second adjacent pages disposed adjacent to the selected page in a second direction; and applying a read voltage to the selected page, and applying the first pass voltage and the second pass voltage to the first adjacent pages and the second adjacent pages, respectively. In setting the first pass voltage and the second pass voltage, a voltage value of the first pass voltage and a voltage value of the second pass voltage may vary depending on a location of the selected page.

An embodiment of the present disclosure may provide for a semiconductor memory device including: a memory block including a plurality of pages; a peripheral circuit configured to perform a read operation on the memory block; and a control logic configured to control the peripheral circuit to perform the read operation. During the read operation, when a selected page of the plurality of pages corresponds to an upper end of a memory cell string, the control logic may set, to a first offset pass voltage, a pass voltage to be applied to first adjacent pages disposed adjacent to the selected page in a first direction, and set a pass voltage to be applied to second adjacent pages disposed adjacent to the selected page in a second direction to a second offset pass voltage having a second flat period longer than a first flat period of the first offset pass voltage.

An embodiment of the present disclosure may provide for a semiconductor memory device including: a memory block including upper pages, a center page, and lower pages; a peripheral circuit configured to perform a read operation on the memory block; and a control logic configured to control the peripheral circuit to perform the read operation and control the peripheral circuit such that, during the read operation, based on a location of a selected page among the plurality of pages, a pass voltage to be applied to first adjacent pages disposed adjacent to the selected page in a first direction and a pass voltage to be applied to second adjacent pages disposed adjacent to the selected page in a second direction have different potential levels and flat periods.

An embodiment of the present disclosure may provide for a method of operating a semiconductor memory device, including: setting a first pass voltage corresponding to first adjacent pages disposed adjacent to a selected page in a first direction during a read operation on a memory block including a plurality of pages; setting a second pass voltage corresponding to second adjacent pages disposed adjacent to the selected page in a second direction; and applying a read voltage to the selected page and applying the first pass voltage and the second pass voltage to the first adjacent pages and the second adjacent pages, respectively. In setting the first pass voltage and the second pass voltage, a flat period of the first pass voltage and a flat period of the second pass voltage may vary in length depending on a location of the selected page.

BRIEF DESCRIPTION OF THE DRAWINGS

FIGS. 7 and 8 are diagrams for describing pass voltages to be applied to unselected pages when a selected page is located at an upper end of the memory cell string.

FIGS. 9 and 10 are diagrams for describing pass voltages to be applied to unselected pages when a selected page is located at a lower end of the memory cell string.

FIG. 11 is a diagram for describing pass voltages to be applied to unselected pages when a selected page is located at a central portion of the memory cell string.

DETAILED DESCRIPTION

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise.

Various embodiments of the present disclosure may be directed to a semiconductor memory device capable of mitigating a read disturb phenomenon during a read operation of the semiconductor memory device, and a method of operating the semiconductor memory device.

Figure 1:
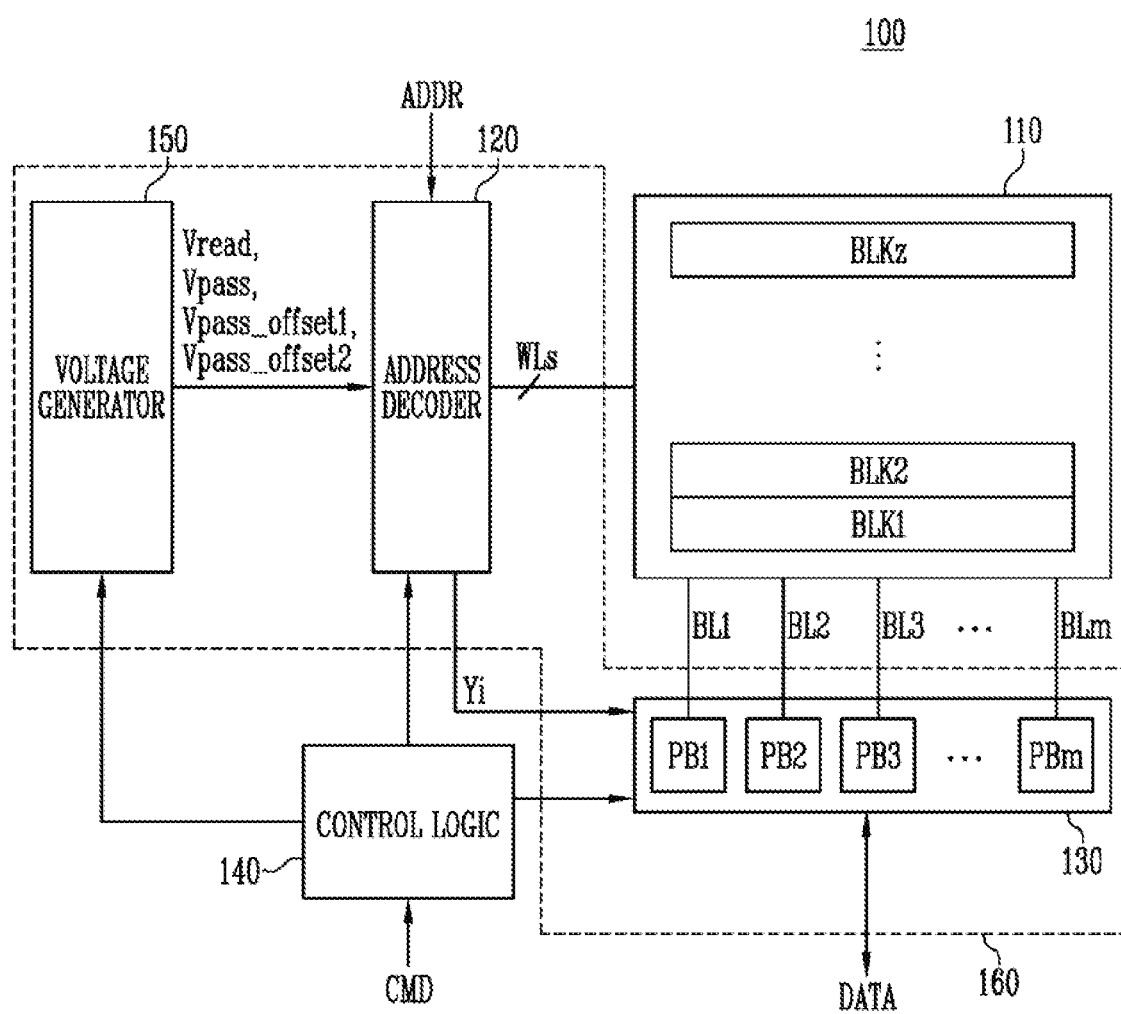
FIG. 1 is a block diagram illustrating a semiconductor memory device in accordance with an embodiment of the present disclosure.

FIG. 1 is a block diagram illustrating a semiconductor memory device 100 in accordance with an embodiment of the present disclosure.

Referring to FIG. 1, the semiconductor memory device 100 may include a memory cell array 110, an address decoder 120, a read/write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLK1 to BLKz. The memory blocks BLK1 to BLKz may be coupled to the address decoder 120 through word lines WLs. The plurality of memory blocks BLK1 to BLKz may be coupled to the read/write circuit 130 through the bit lines BL1 to BLm. Each of the memory blocks BLK1 to BLKz may include a plurality of memory cells. In an embodiment, the plurality of memory cells may be nonvolatile memory cells. Memory cells coupled to one word line among the plurality of memory cells may be defined as one page. In other words, the memory cell array 110 may be formed of a plurality of pages.

In addition, each of the memory blocks BLK1 to BLKz of the memory cell array 110 may include a plurality of memory cell strings. Each of the memory cell strings may include a drain select transistor, a plurality of memory cells, and a source select transistor that are connected in series between a bit line and a source line. The memory cell array 110 will be described in detail later herein.

The address decoder 120, the read/write circuit 130, and the voltage generator 150 may be operated as a peripheral circuit 160 for driving the memory cell array 110.

The address decoder 120 may be coupled to the memory cell array 110 through the word lines WLs. The address decoder 120 may operate under control of the control logic 140. The address decoder 120 may receive addresses ADDR through an input/output buffer (not shown) provided in the semiconductor memory device 100.

During a read operation, the address decoder 120 may transmit a read voltage Vread, a reference pass voltage Vpass, a first offset pass voltage Vpass_offset1, and a second offset pass voltage Vpass_offset2 that are generated from the voltage generator 150, to the word lines WLs of the memory cell array 110 based on the received addresses ADDR.

For example, during a read operation, the address decoder 120 may apply a read voltage Vread to a selected word line among the word lines WLs, apply a first offset pass voltage Vpass_offset1 or a second offset pass voltage Vpass_offset2 to word lines adjacent to the select word line, and apply a reference pass voltage Vpass to the other unselected word lines.

The address decoder 120 may decode a column address among the received addresses ADDR. The address decoder 120 may transmit the decoded column address Yi to the read/write circuit 130.

Addresses ADDR received during the read operation may include a block address, a row address, and a column address. The address decoder 120 may select one memory block and one word line in response to a block address and a row address. The column address Yi may be decoded by the address decoder 120 and provided to the read/write circuit 130.

The address decoder 120 may include a block decoder, a row decoder, a column decoder, an address buffer, etc.

The read/write circuit 130 may include a plurality of page buffers PB1 to PBm. The page buffers PB1 to PBm may be coupled to the memory cell array 110 through the bit lines BL1 to BLm. Here, during the read operation, each of the page buffers PB1 to PBm may sense a potential level or current of a corresponding one of the bit lines BL1 to BLm to perform the read operation.

The read/write circuit 130 may operate in response to control of the control logic 140.

In an embodiment, the read/write circuit 130 may include page buffers (or page registers), a column select circuit, etc.

The control logic 140 is coupled to the address decoder 120, the read/write circuit 130, and the voltage generator 150. The control logic 140 may receive a command CMD through an input/output buffer (not shown) of the semiconductor memory device 100. The control logic 140 may control the read operation of the semiconductor memory device 100 in response to the command CMD.

During the read operation, the control logic 140 may control the address decoder 120, the read/write circuit 130, and the voltage generator 150 to perform the read operation on a plurality of memory cells included in the selected page. Furthermore, during the read operation, the control logic 140 may control the address decoder 120 to apply, depending on a physical location of the selected page, the first offset pass voltage Vpass_offset1 or the second offset pass voltage Vpass_offset2 to at least one or more pages disposed adjacent to the selected page in a first direction. Furthermore, during the read operation, the control logic 140 may control the address decoder 120 to apply, depending on a physical location of the selected page, the first offset pass voltage Vpass_offset1 or the second offset pass voltage Vpass_offset2 to at least one or more pages disposed adjacent to the selected page in a second direction. For example, during the read operation, if the selected page is located at an upper end of the memory cell string, the control logic 140 may control the address decoder 120 to apply the first offset pass voltage Vpass_offset1 to at least one or more pages adjacent to the selected page in the first direction and apply the second offset pass voltage Vpass_offset2 to at least one or more pages adjacent to the selected page in the second direction. Also, during the read operation, if the selected page is located at a lower end of the memory cell string, the control logic 140 may control the address decoder 120 to apply the second offset pass voltage Vpass_offset2 to at least one or more pages adjacent to the selected page in the first direction and apply the first offset pass voltage Vpass_offset1 to at least one or more pages adjacent to the selected page in the second direction. Furthermore, during the read operation, if the selected page is located at a central portion of the memory cell string, the control logic 140 may control the address decoder 120 to apply the reference pass voltage Vpass to all unselected pages other than the selected page. The first direction may refer to a direction toward the bit lines. The second direction may refer to a direction toward the source lines.

During a read operation, the voltage generator 150 may generate and output a read voltage Vread, a reference pass voltage Vpass, a first offset pass voltage Vpass_offset1, and a second offset pass voltage Vpass_offset2 under control of the control logic 140. The first offset pass voltage Vpass_offset1 may have a potential lower than that of the reference pass voltage Vpass. The second offset pass voltage Vpass_offset2 may have a potential higher than that of the reference pass voltage Vpass.

The reference pass voltage Vpass, the first offset pass voltage Vpass_offset1, and the second offset pass voltage Vpass_offset2 may be increased in potential level in a stepped pattern and be applied during each set flat period. For example, the stepped pattern includes steps each of which has a flat period representing a period of time whereby a voltage may be applied for a duration of the flat period. A flat period of the first offset pass voltage Vpass_offset1 may be set to a period shorter than a flat period of the reference pass voltage Vpass. A flat period of the second offset pass voltage Vpass_offset2 may be set to a period longer than the flat period of the reference pass voltage Vpass.

Figure 2:
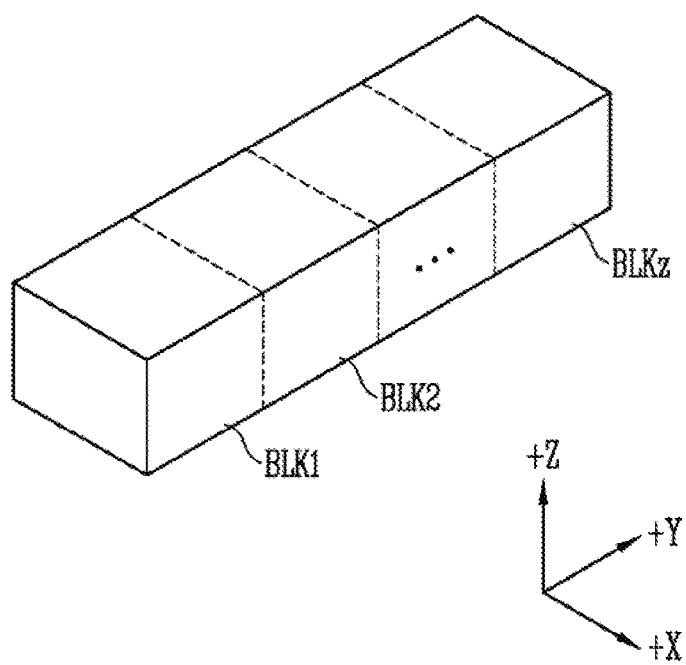
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 includes the plurality of memory blocks BLK1 to BLKz. Each memory block has a three-dimensional structure. Each memory block includes a plurality of memory cells stacked on a substrate. The memory cells are arranged in +X, +Y, and +Z directions. The structure of each memory block will be described with reference to FIGS. 3 and 5.

Figure 3:
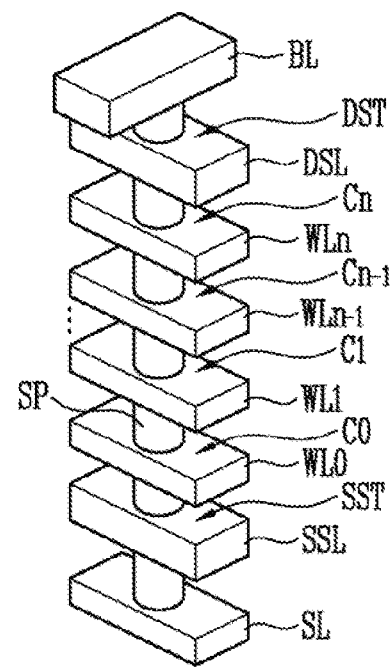
FIG. 3 is a three-dimensional diagram illustrating a memory cell string included in a memory block in accordance with the present disclosure.

FIG. 3 is a three-dimensional diagram illustrating a memory cell string included in a memory block in accordance with the present disclosure.

Referring to FIG. 3, a source line SL may be formed on a semiconductor substrate. A vertical channel layer SP may be formed on the source line SL. An upper portion of the vertical channel layer SP is coupled to a corresponding bit line BL. The vertical channel layer SP may be made of polysilicon. A plurality of conductive layers SSL, WL0 to WLn, and DSL are formed to enclose the vertical channel layer SP at different heights on the vertical channel layer SP. Multi-layers (not shown) including a charge storage layer is formed on a surface of the vertical channel layer SP. The multi-layers are also disposed between the vertical channel layer SP and the conductive layers SSL, WL0 to WLn, and DSL. The multi-layers may be formed in an ONO structure including an oxide layer, a nitride layer, and an oxide layer that are successively stacked.

The lowermost conductive layer forms a source select line SSL. The uppermost conductive layer forms a drain select line DSL. The conductive layers disposed between the select lines SSL and DSL form the respective word lines WL0 to WLn. In other words, the conductive layers SSL, WL0 to WLn, and DSL are formed in a multi-layer structure on the semiconductor substrate. The vertical channel layer SP passing through the conductive layers SSL, WL0 to WLn, and DSL is vertically coupled between the bit line BL and the source line SL formed on the semiconductor substrate.

The drain select transistor DST is formed on a portion of the uppermost conductive layer DSL that encloses the vertical channel layer SP. The source select transistor SST is formed on a portion of the lowermost conductive layer SSL that encloses the vertical channel layer SP. Memory cells MC0 to MCn are respectively formed on portions of the center conductive layers WL0 to WLn that enclose the vertical channel layer SP.

In this way, the memory string includes the source select transistor SST, the memory cells C0 to Cn, and the drain select transistor DST, which are vertically connected to the substrate between the source line SL and the bit line BL. The source select transistor SST may electrically connect the memory cells C0 to Cn to the source line SL depending on a source control voltage to be applied to the source select line SSL. The drain select transistor DST may electrically connect the memory cells C0 to Cn to the bit line BL depending on a drain control voltage to be applied to the drain select line DSL.

Figure 4:
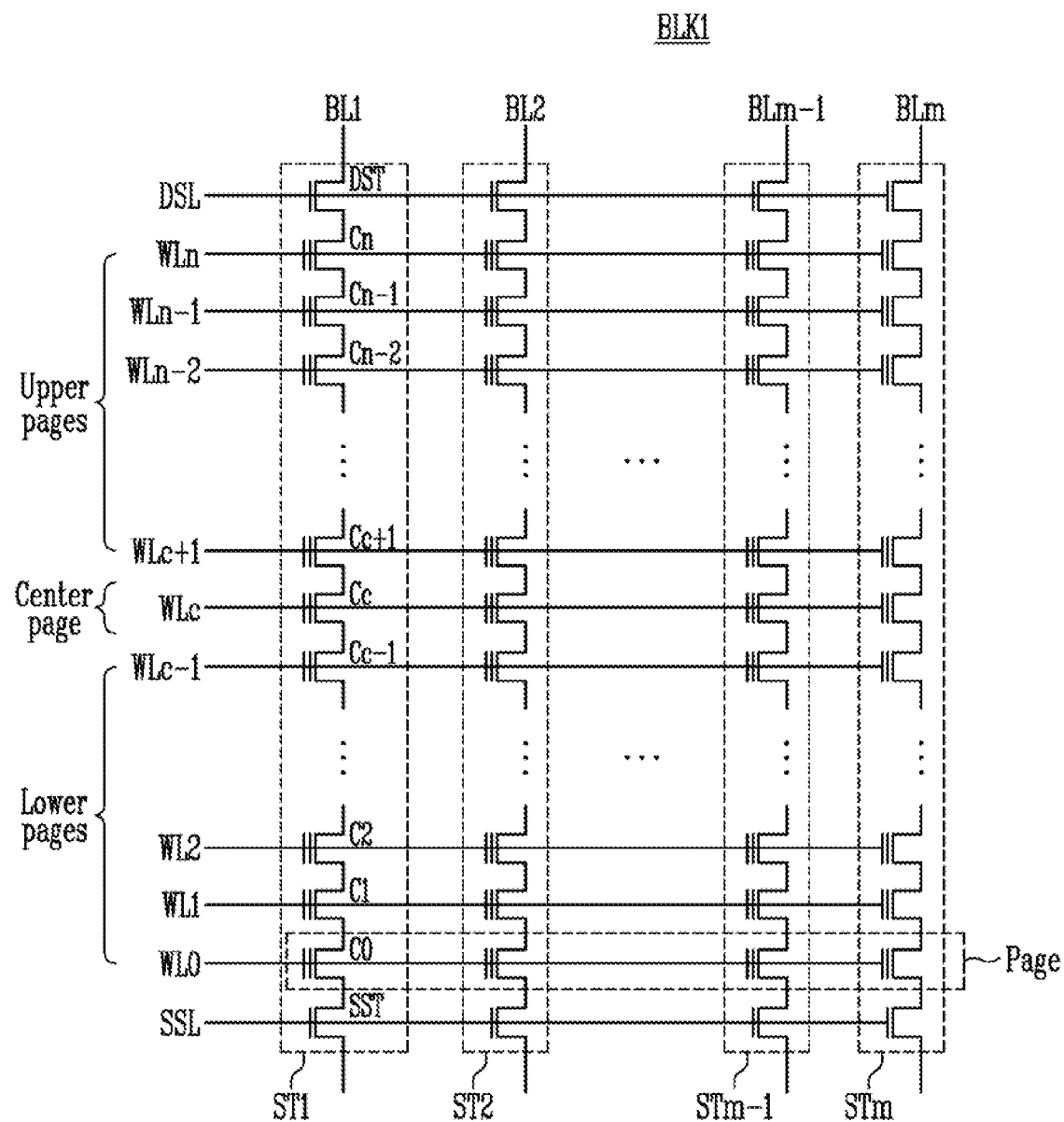
FIG. 4 is a circuit diagram illustrating a memory block in accordance with an embodiment of the present disclosure.

FIG. 4 is a circuit diagram illustrating a memory block in accordance with an embodiment of the present disclosure.

Referring to FIG. 4, in one memory block (e.g., BLK1), a plurality of word lines arranged parallel to each other may be coupled between a first select line and a second select line. Here, the first select line may be a source select line SSL, and the second select line may be a drain select line DSL. For example, the memory block BLK1 may include a plurality of strings ST1 to STm coupled between the bit lines BL1 to BLm and the source line SL. The bit lines BL1 to BLm may be respectively coupled to the memory cell strings ST1 to STm, and the source line SL may be coupled in common to the memory cell strings ST1 to STm. The memory cell strings ST1 to STm may have the same configuration; therefore, the memory cell string ST1 that is coupled to the first bit line BL1 will be described by way of example.

The memory cell string ST1 may include a source select transistor SST, a plurality of memory cells C0 to Cn, and a drain select transistor DST which are coupled in series to each other between the source line SL and the first bit line BL1. At least one source select transistor SST and at least one drain select transistor DST may be included in the memory cell string ST1.

A source of the source select transistor SST may be coupled to the source line SL, and a drain of the drain select transistor DST may be coupled to the first bit line BL1. The plurality of memory cells C0 to Cn may be coupled in series between the source select transistor SST and the drain select transistor DST. Gates of the source select transistors SST included in different memory cell strings may be coupled to the source select line SSL, gates of the drain select transistors DST may be coupled to the drain select line DSL, and gates of the plurality of memory cells C0 to Cn may be coupled to the plurality of word lines WL0 to WLn. A group of memory cells coupled to the same word line among the memory cells included in different memory cell strings ST1 to STm may be referred to as a page. Therefore, the number of pages included in the memory block BLK1 may correspond to the number of word lines WL1 to WLn.

A page disposed at central portions of the memory cell strings ST1 to STm among the plurality of pages, e.g., a page corresponding to a word line WLc, may be defined as a center page. Pages disposed between the center page and the drain select line DSL may be defined as upper pages. Pages disposed between the center page and the source select line SSL may be defined as lower pages. In other words, the plurality of pages included in the memory block BLK1 may be divided into upper pages, a center page, and lower pages based on physical positions of the corresponding memory cell strings.

Although in an embodiment the center page has been described as being one page, at least one or more pages may be defined as center pages.

Although not illustrated in FIG. 4, a plurality of memory cell strings may be coupled to one bit line. The plurality of memory cell strings coupled to one bit line may share word lines, and be coupled to different drain select lines. In the case where during a read operation one memory cell string of a plurality of memory cell strings coupled to one bit line is to be selected, a turn-on voltage may be applied to a drain select line corresponding to a memory cell string to be selected, and a turn-off voltage may be applied to drain select lines corresponding to the other unselected memory cell strings.

Figure 5:
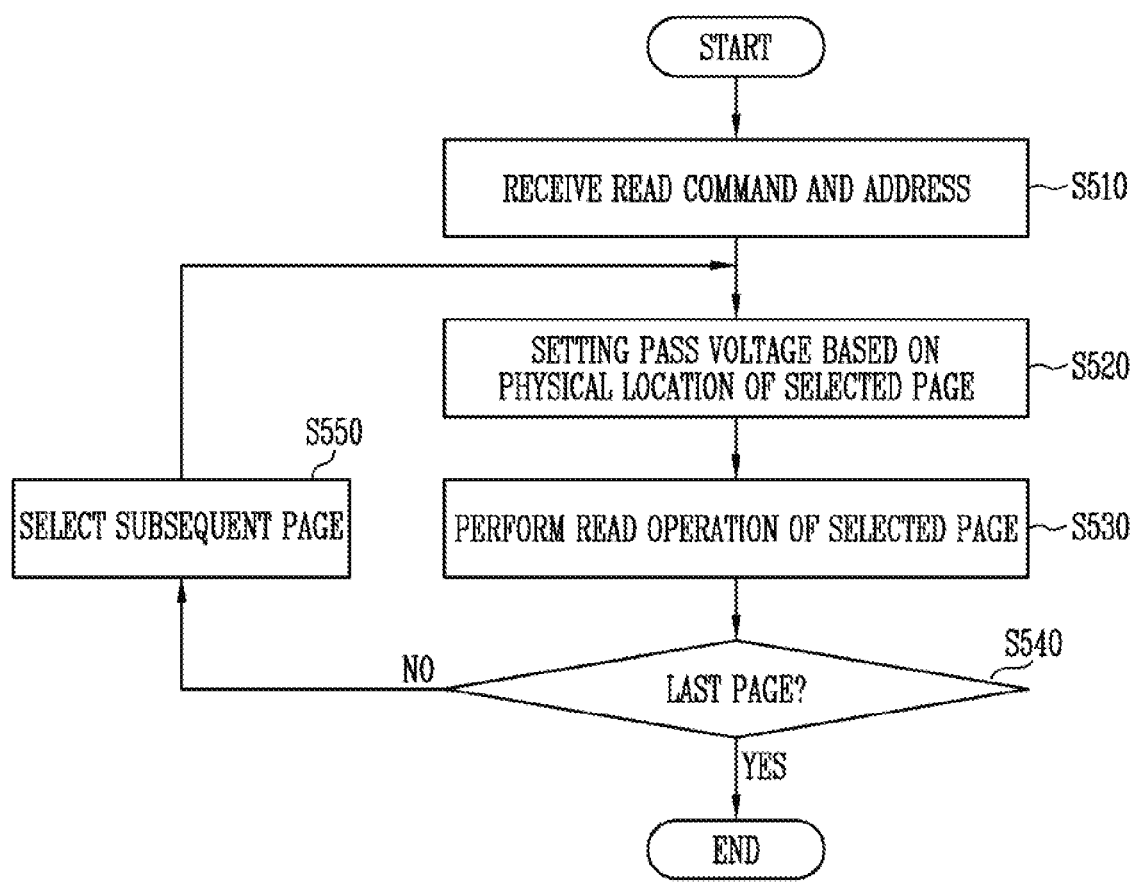
FIG. 5 is a flowchart illustrating a read operation of a semiconductor memory device according to an embodiment of the present disclosure.

FIG. 5 is a flowchart illustrating a read operation of a semiconductor memory device according to an embodiment of the present disclosure.

The read operation of the semiconductor memory device in accordance with an embodiment of the present disclosure will be described with reference to FIGS. 1 to 5.

The semiconductor memory device 100 may receive a command CMD and an address ADDR corresponding to the read operation from an external device (at step S510). The control logic 140 may generate and output control signals for controlling the voltage generator 150, the address decoder 120, and the read/write circuit 130 to perform the read operation on the memory block (e.g., BLK1) corresponding to the address ADDR in response to the command CMD.

The control logic 140 may select one page of a plurality of pages included in the selected memory block BLK1 during the read operation, and set, based on a physical location of the selected page, pass voltages to be applied to pages adjacent to the selected page and pass voltages to be applied to the other unselected pages (at step S520).

For example, when the selected page is included in the upper pages, the control logic 140 may set, to the first offset pass voltage Vpass_offset1, pass voltages to be applied to at least one or more pages adjacent to the selected page in the first direction (the direction toward the bit line), and set, to the second offset pass voltage Vpass_offset2, pass voltages to be applied to at least one or more pages adjacent to the selected page in the second direction (the direction toward the source line). When the selected page is included in the lower pages, the control logic 140 may set, to the second offset pass voltage Vpass_offset2, pass voltages to be applied to at least one or more pages adjacent to the selected page in the first direction (the direction toward the bit line), and set, to the first offset pass voltage Vpass_offset1, pass voltages to be applied to at least one pages adjacent to the selected page in the second direction (the direction toward the source line). When the selected page is included in the center page, the control logic 140 may set, to the reference pass voltage Vpass, pass voltages to be applied to at least one or more pages adjacent to the selected page in the first direction (the direction toward the bit line) and the second direction (the direction toward the source line).

A method of setting pass voltages to be applied to pages adjacent to the selected page will be described with reference to FIG. 6.

The peripheral circuit 160 may perform a read operation on the selected page (at step S530). For example, the voltage generator 150 may generate a read voltage Vread, a reference pass voltage Vpass, a first offset pass voltage Vpass_offset1, and a second offset pass voltage Vpass_offset2 under control of the control logic 140. Under control of the control logic 140, the address decoder 120 may apply the read voltage Vread to the selected page of the selected memory block BLK1, and apply the first offset pass voltage Vpass_offset1, the second offset pass voltage Vpass_offset2, or the reference pass voltage Vpass to pages adjacent to the selected page. Each of the plurality of page buffers PB1 to PBm included in the read/write circuit 130 may sense a potential level or current of a corresponding one of the bit lines BL1 to BLm to perform the read operation.

The control logic 140 may check whether the current selected page on which the read operation has been performed is a last page among the pages corresponding to the read operation (at step S540). If the current selected page is the last page corresponding to the read operation (refer to "YES"), the read operation is terminated. If the current selected page is not the last page corresponding to the read operation (refer to "NO"), the control logic 140 may select a subsequent page (at step S550) and reperform the process from step S520.

Figure 6:
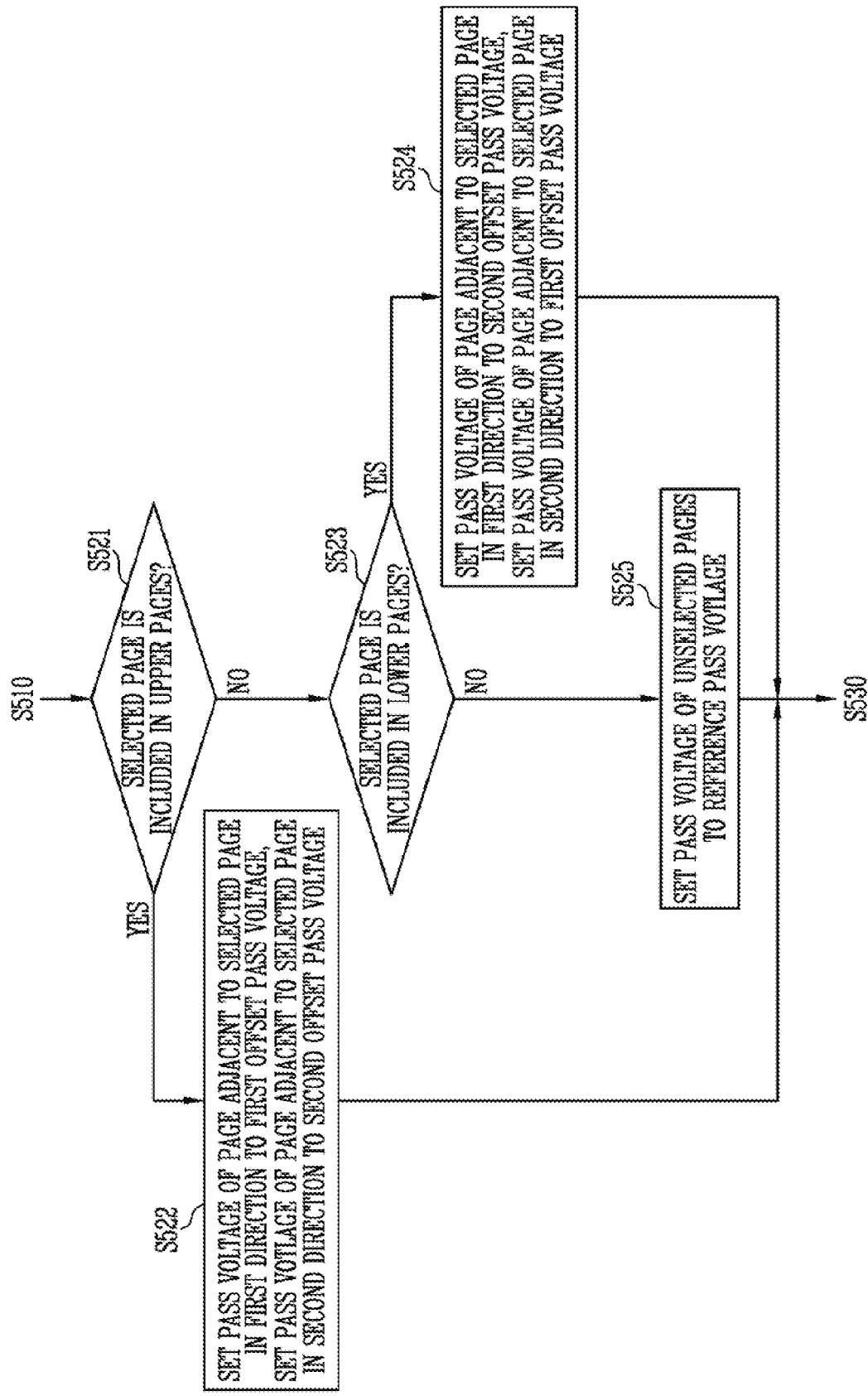
FIG. 6 is a flowchart for describing step S520 of FIG. 5.

FIG. 6 is a flowchart for describing step S520 of FIG. 5.

A method of setting pass voltages to be applied to unselected pages during a read operation in accordance with an embodiment of the present disclosure will be described with reference to FIG. 6.

After step S510 of FIG. 5, the control logic 140 may determine whether the selected page is included in the upper pages (at step S521).

As a result of the determination of step S521, if the selected page is included in the upper pages (refer to "YES"), the control logic 140 may set, to the first offset pass voltage Vpass_offset1, pass voltages to be applied to at least one or more pages adjacent to the selected page in the first direction (the direction toward the bit line), and set, to the second offset pass voltage Vpass_offset2, pass voltages to be applied to at least one or more pages adjacent to the selected page in the second direction (the direction toward the source line).

As the result of the determination of step S521, if the selected page is not included in the upper pages (refer to "NO"), the control logic 140 may determine whether the selected page is included in the lower pages (at step S523).

As a result of the determination of step S523, if the selected page is included in the lower pages (refer to "YES"), the control logic 140 may set, to the second offset pass voltage Vpass_offset2, pass voltages to be applied to at least one or more pages adjacent to the selected page in the first direction (the direction toward the bit line), and set, to the first offset pass voltage Vpass_offset1, pass voltages to be applied to at least one or more pages adjacent to the selected page in the second direction (the direction toward the source line), at step S524.

As a result of the determination of step S523, if the selected page is not included in the lower pages (refer to "NO"), the control logic 140 may determine that the selected page is included in the center page, and set pass voltages to be applied to the unselected pages other than the selected page to the reference pass voltage Vpass (at step S525). Thereafter, step S530 of FIG. 5 may be performed.

Figure 8:
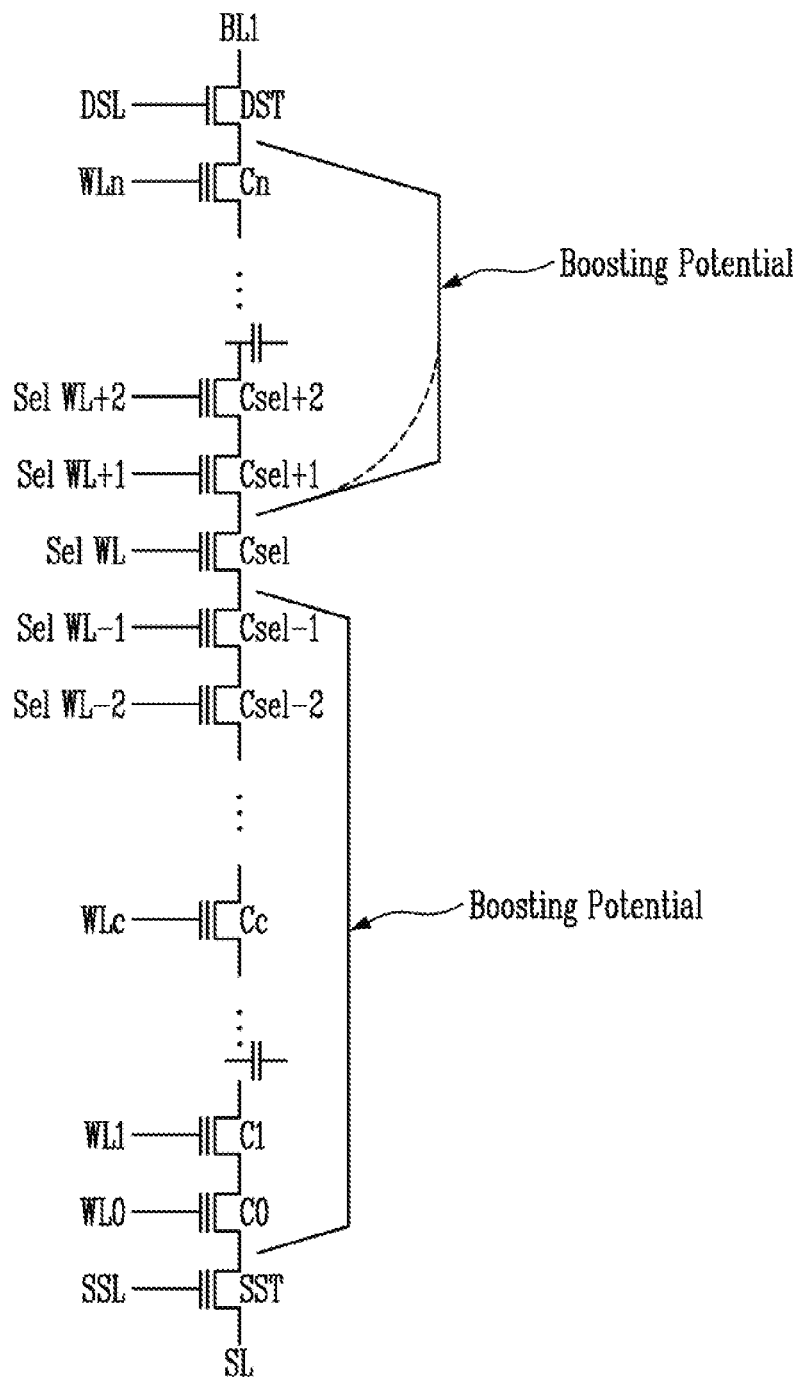

FIGS. 7 and 8 are diagrams for describing pass voltages to be applied to unselected pages when a selected page is located at the upper end of the memory cell string.

If during a read operation the selected page is included in the upper pages, pass voltages to be applied to word lines Sel WL+1 and Sel WL+2 coupled with at least one or more pages adjacent to the selected page in the first direction (the direction toward the bit line) may be set to the first offset pass voltage Vpass_offset1, as illustrated in FIG. 7. Also, pass voltages to be applied to the word lines Sel WL−1 and Sel WL−2 coupled with at least one or more pages adjacent to the selected page in the second direction (the direction toward the source line) may be set to the second offset pass voltage Vpass_offset2, and pass voltages to be applied to the word lines WL0, WL1, . . . , WLc, . . . , WLn coupled to the other unselected pages may be set to the reference pass voltage Vpass.

In the case where the pass voltages are set as illustrated in FIG. 7, if a read voltage application operation is performed on the selected page, a self-boosting phenomenon may occur on channels of unselected memory cell strings among a plurality of memory cell strings coupled to one bit line, as illustrated in FIG. 8. In other words, the unselected memory cell strings that share the word lines with the selected memory cell strings may be self-boosted by the first offset pass voltage Vpass_offset1, the second offset pass voltage Vpass_offset2, and the reference pass voltage Vpass that are applied to the selected memory cell strings. A boosting area of the channel that corresponds to memory cells Csel+1 to Cn disposed in the first direction based on a selected memory cell Csel to which the read voltage Vread is to be applied may have a relatively high boost potential level because the length of the boosting area is shorter than that of a boosting area of the channel that corresponds to memory cells Csel−1 to C0 disposed in the second direction. Hence, a hot carrier injection (HCI) phenomenon, in which hot carriers occur in a lower channel area of the selected memory cell Csel and are injected into a channel area adjacent thereto in the first direction, may be caused. To overcome the foregoing problem, if the first offset pass voltage Vpass_offset1 lower than the reference pass voltage Vpass is applied to the memory cells Csel+1 and Csel+2 adjacent to the selected memory cell Csel in the first direction, the boosting potential level of the channel may descend as illustrated by the dashed line of FIG. 8. Consequently, the HCI phenomenon of the unselected memory strings during read operation may be mitigated.

Figure 10:
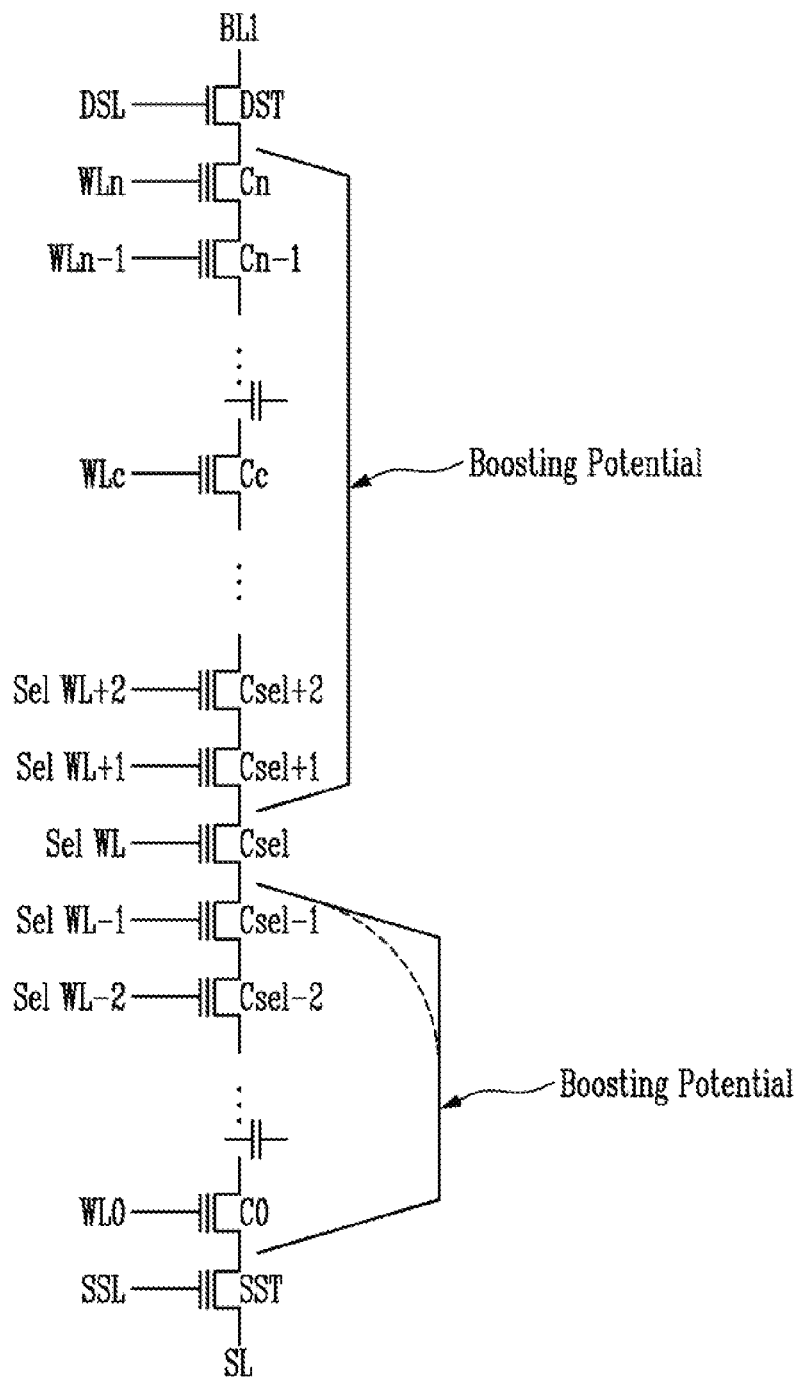

FIGS. 9 and 10 are diagrams for describing pass voltages to be applied to unselected pages when the selected page is located at the lower end of the memory cell string.

If during a read operation the selected page is included in the lower pages, pass voltages to be applied to word lines Sel WL+1 and Sel WL+2 coupled with at least one or more pages adjacent to the selected page in the first direction (the direction toward the bit line) may be set to the second offset pass voltage Vpass_offset2, as illustrated in FIG. 9. Also, pass voltages to be applied to the word lines Sel WL−1 and Sel WL−2 coupled with at least one or more pages adjacent to the selected page in the second direction (the direction toward the source line) may be set to the first offset pass voltage Vpass_offset1, and pass voltages to be applied to the word lines WL0, . . . , WLc, . . . , WLn−1, and WLn coupled to the other unselected pages may be set to the reference pass voltage Vpass.

In the case where the pass voltages are set as illustrated in FIG. 9, if a read voltage application operation is performed on the selected page, a self-boosting phenomenon may occur on channels of unselected memory cell strings among a plurality of memory cell strings coupled to one bit line, as illustrated in FIG. 10. In other words, the unselected memory cell strings that share the word lines with the selected memory cell strings may be self-boosted by the first offset pass voltage Vpass_offset1, the second offset pass voltage Vpass_offset2, and the reference pass voltage Vpass that are applied to the selected memory cell strings. A boosting area of the channel that corresponds to memory cells Csel−1 to C0 disposed in the second direction based on a selected memory cell Csel to which the read voltage Vread is to be applied may have a relatively high boost potential level because the length of the boosting area is shorter than that of a boosting area of the channel that corresponds to memory cells Csel+1 to Cn disposed in the first direction. Hence, an HCI phenomenon, in which hot carriers occur in a lower channel area of the selected memory cell Csel and are injected into a channel area adjacent thereto in the second direction, may be caused. To overcome the foregoing problem, if the first offset pass voltage Vpass_offset1 lower than the reference pass voltage Vpass is applied to the memory cells Csel−1 and Csel−2 adjacent to the selected memory cell Csel in the second direction, the boosting potential level of the channel may descend as illustrated by the dashed line of FIG. 10. Consequently, the HCI phenomenon of the unselected memory strings during read operation may be mitigated.

FIGS. 11 is a diagram for describing pass voltages to be applied to unselected pages when the selected page is located at the central portion of the memory cell string.

Referring to FIG. 11, if during the read operation the selected page is included in the center page, pass voltages to be applied to word lines Sel WL+1 to WLn coupled with pages disposed at a side corresponding to the first direction (the direction toward the bit line) of the selected page may be set to the reference pass voltage Vpass, and pass voltages to be applied to word lines Sel WL−1 to WL0 coupled with pages disposed at a side corresponding to the second direction (the direction toward the source line) of the selected page may also be set to the reference pass voltage Vpass.

In the case where the pass voltages are set as described with FIG. 11, if a read voltage application operation is performed on the selected page, channels of unselected memory cell strings among a plurality of memory cell strings coupled to one bit line may be self-boosted by the reference pass voltage Vpass. The length of the channel boosting area disposed at a side corresponding to the first direction is similar to that of the channel boosting area disposed at a side corresponding to the first direction. Hence, the channel boosting potential level may be reduced by applying the reference pass voltage Vpass lower than the second offset pass voltage Vpass_off2 to pages adjacent to the selected page in the first direction and the second direction. Thereby, the HCI phenomenon may be prevented.

Figure 12:
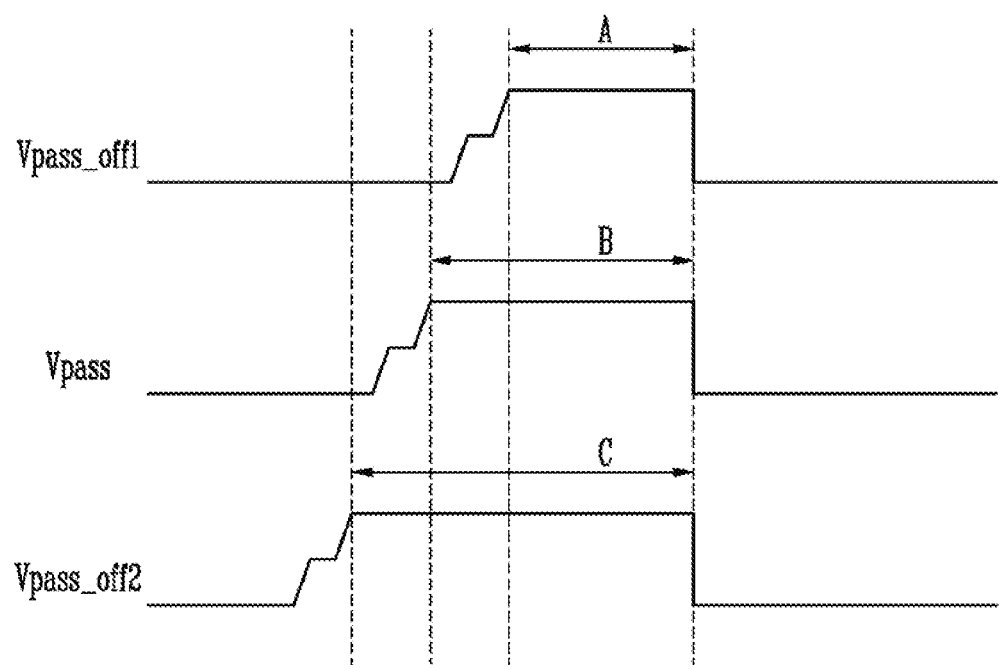
FIG. 12 is a diagram for describing pass voltages to be applied to unselected pages in accordance with an embodiment of the present disclosure.

FIG. 12 is a diagram for describing pass voltages to be applied to unselected pages in accordance with an embodiment of the present disclosure.

Pass voltages to be applied to the unselected pages when the selected page is located at the upper end of the memory cell string will be described with reference to FIGS. 7, 8, and 12.

If during a read operation the selected page is included in the upper pages, pass voltages to be applied to word lines Sel WL+1 and Sel WL+2 coupled with at least one or more pages adjacent to the selected page in the first direction (the direction toward the bit line) may be set to the first offset pass voltage Vpass_offset1, as illustrated in FIG. 7. Also, pass voltages to be applied to the word lines Sel WL−1 and Sel WL−2 coupled with at least one or more pages adjacent to the selected page in the second direction (the direction toward the source line) may be set to the second offset pass voltage Vpass_offset2, and pass voltages to be applied to the word lines WL0, WL1, . . . , WLc, . . . , WLn coupled to the other unselected pages may be set to the reference pass voltage Vpass. The reference pass voltage Vpass, the first offset pass voltage Vpass_offset1, and the second offset pass voltage Vpass_offset2 may be increased in potential level in a stepped pattern and be applied during each set flat period. For example, a flat period A of the first offset pass voltage Vpass_offset1 may be set to a period shorter than a flat period B of the reference pass voltage Vpass. A flat period C of the second offset pass voltage Vpass_offset2 may be set to a period longer than the flat period C of the reference pass voltage Vpass.

In the case where the pass voltages are set as illustrated in FIGS. 7 and 12, if a read voltage application operation is performed on the selected page, a self-boosting phenomenon may occur on channels of unselected memory cell strings among a plurality of memory cell strings coupled to one bit line, as illustrated in FIG. 8. In other words, the unselected memory cell strings that share the word lines with the selected memory cell strings may be self-boosted by the first offset pass voltage Vpass_offset1, the second offset pass voltage Vpass_offset2, and the reference pass voltage Vpass that are applied to the selected memory cell strings. A boosting area of the channel that corresponds to memory cells Csel+1 to Cn disposed in the first direction based on a selected memory cell Csel to which the read voltage Vread is to be applied may have a relatively high boost potential level because the length of the boosting area is shorter than that of a boosting area of the channel that corresponds to memory cells Csel−1 to C0 disposed in the second direction. Hence, a hot carrier injection (HCI) phenomenon, in which hot carriers occur in a lower channel area of the selected memory cell Csel and are injected into a channel area adjacent thereto in the first direction, may be caused. To overcome the foregoing problem, if the first offset pass voltage Vpass_offset1 having the flat period A shorter than the flat period B of the reference pass voltage Vpass is applied to the memory cells Csel+1 and Csel+2 adjacent to the selected memory cell Csel in the first direction, the boosting potential level of the channel may descend as illustrated by the dashed line of FIG. 8. Consequently, the HCI phenomenon of the unselected memory strings during read operation may be mitigated.

Pass voltages to be applied to the unselected pages when the selected page is located at the lower end of the memory cell string will be described with reference to FIGS. 9, 10, and 12.

If during a read operation the selected page is included in the lower pages, pass voltages to be applied to word lines Sel WL+1 and Sel WL+2 coupled with at least one or more pages adjacent to the selected page in the first direction (the direction toward the bit lines) may be set to the second offset pass voltage Vpass_offset2, as illustrated in FIG. 9. Also, pass voltages to be applied to the word lines Sel WL−1 and Sel WL−2 coupled with at least one or more pages adjacent to the selected page in the second direction (the direction toward the source line) may be set to the first offset pass voltage Vpass_offset1, and pass voltages to be applied to the word lines WL0, . . . , WLc, . . . , WLn−1, and WLn coupled to the other unselected pages may be set to the reference pass voltage Vpass. The reference pass voltage Vpass, the first offset pass voltage Vpass_offset1, and the second offset pass voltage Vpass_offset2 may be increased in potential level in a stepped pattern and be applied during each set flat period. For example, a flat period A of the first offset pass voltage Vpass_offset1 may be set to a period shorter than a flat period B of the reference pass voltage Vpass. A flat period C of the second offset pass voltage Vpass_offset2 may be set to a period longer than the flat period C of the reference pass voltage Vpass.

In the case where the pass voltages are set as illustrated in FIGS. 9 and 12, if a read voltage application operation is performed on the selected page, a self-boosting phenomenon may occur on channels of unselected memory cell strings among a plurality of memory cell strings coupled to one bit line, as illustrated in FIG. 10. In other words, the unselected memory cell strings that share the word lines with the selected memory cell strings may be self-boosted by the first offset pass voltage Vpass_offset1, the second offset pass voltage Vpass_offset2, and the reference pass voltage Vpass that are applied to the selected memory cell strings. A boosting area of the channel that corresponds to memory cells Csel−1 to C0 disposed in the second direction based on a selected memory cell Csel to which the read voltage Vread is to be applied may have a relatively high boost potential level because the length of the boosting area is shorter than that of a boosting area of the channel that corresponds to memory cells Csel+1 to Cn disposed in the first direction. Hence, an HCI phenomenon, in which hot carriers occur in a lower channel area of the selected memory cell Csel and are injected into a channel area adjacent thereto in the second direction, may be caused. To overcome the foregoing problem, if the first offset pass voltage Vpass_offset1 having the flat period A shorter than the flat period B of the reference pass voltage Vpass is applied to the memory cells Csel−11 and Csel−2 adjacent to the selected memory cell Csel in the second direction, the boosting potential level of the channel may descend as illustrated by the dashed line of FIG. 10. Consequently, the HCI phenomenon of the unselected memory strings during read operation may be mitigated.

Figure 13:
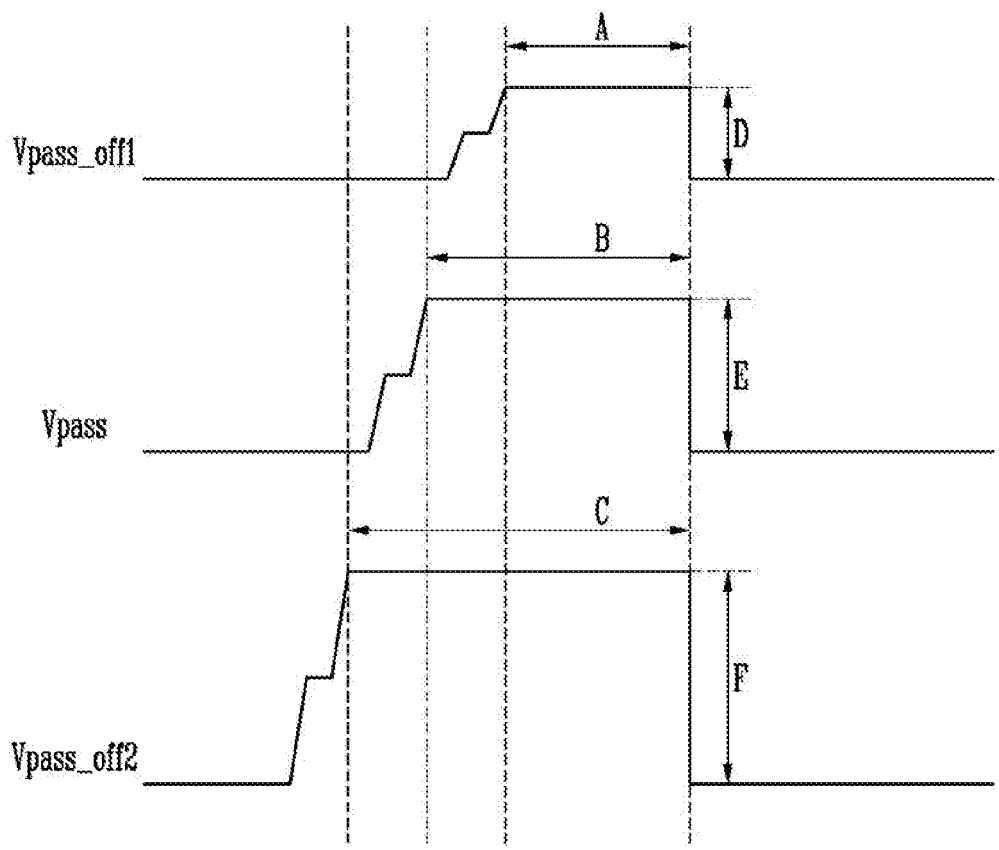
FIG. 13 is a diagram for describing pass voltages to be applied to unselected pages in accordance with an embodiment of the present disclosure.

FIG. 13 is a diagram for describing pass voltages to be applied to unselected pages in accordance with an embodiment of the present disclosure.

Pass voltages to be applied to the unselected pages when the selected page is located at the upper end of the memory cell string will be described with reference to FIGS. 7, 8, and 13.

If during a read operation the selected page is included in the upper pages, pass voltages to be applied to word lines Sel WL+1 and Sel WL+2 coupled with at least one or more pages adjacent to the selected page in the first direction (the direction toward the bit line) may be set to the first offset pass voltage Vpass_offset1, as illustrated in FIG. 7. Also, pass voltages to be applied to the word lines Sel WL−1 and Sel WL−2 coupled with at least one or more pages adjacent to the selected page in the second direction (the direction toward the source line) may be set to the second offset pass voltage Vpass_offset2, and pass voltages to be applied to the word lines WL0, WL1, . . . , WLc, . . . , WLn coupled to the other unselected pages may be set to the reference pass voltage Vpass. The reference pass voltage Vpass, the first offset pass voltage Vpass_offset1, and the second offset pass voltage Vpass_offset2 may be increased in potential level in a stepped pattern and be applied during each set flat period. For example, a potential D of the first offset pass voltage Vpass_offset1 may be lower than a potential E of the reference pass voltage Vpass. A potential F of the second offset pass voltage Vpass_offset2 may be higher than the potential E of the reference pass voltage Vpass. Furthermore, a flat period of the first offset pass voltage Vpass_offset1 may be set to a period shorter than a flat period of the reference pass voltage Vpass. A flat period of the second offset pass voltage Vpass_offset2 may be set to a period longer than the flat period of the reference pass voltage Vpass.

In the case where the pass voltages are set as illustrated in FIGS. 7 and 13, if a read voltage application operation is performed on the selected page, a self-boosting phenomenon may occur on channels of unselected memory cell strings among a plurality of memory cell strings coupled to one bit line, as illustrated in FIG. 8. In other words, the unselected memory cell strings that share the word lines with the selected memory cell strings may be self-boosted by the first offset pass voltage Vpass_offset1, the second offset pass voltage Vpass_offset2, and the reference pass voltage Vpass that are applied to the selected memory cell strings. A boosting area of the channel that corresponds to memory cells Csel+1 to Cn disposed in the first direction based on the selected memory cell Csel to which the read voltage Vread is to be applied may have a relatively high boost potential level because the length of the boosting area is shorter than that of a boosting area of the channel that corresponds to memory cells Csel−1 to C0 disposed in the second direction. Hence, a hot carrier injection (HCI) phenomenon, in which hot carriers occur in a lower channel area of the selected memory cell Csel and are injected into a channel area adjacent thereto in the first direction, may be caused. To overcome the foregoing problem, if the first offset pass voltage Vpass_offset1 having the potential D lower than the potential E of the reference pass voltage Vpass and having the flat period A shorter than the flat period B of the reference pass voltage Vpass is applied to the memory cells Csel+1 and Csel+2 adjacent to the selected memory cell Csel in the first direction, the boosting potential level of the channel may descend as illustrated by the dashed line of FIG. 8. Consequently, the HCI phenomenon of the unselected memory strings during read operation may be mitigated.

Pass voltages to be applied to the unselected pages when the selected page is located at the lower end of the memory cell string will be described with reference to FIGS. 9, 10, and 13.

If during a read operation the selected page is included in the lower pages, pass voltages to be applied to word lines Sel WL+1 and Sel WL+2 coupled with at least one or more pages adjacent to the selected page in the first direction (the direction toward the bit lines) may be set to the second offset pass voltage Vpass_offset2, as illustrated in FIG. 9. Also, pass voltages to be applied to the word lines Sel WL−1 and Sel WL−2 coupled with at least one or more pages adjacent to the selected page in the second direction (the direction toward the source line) may be set to the first offset pass voltage Vpass_offset1, and pass voltages to be applied to the word lines WL0, . . . , WLc, . . . , WLn−1, and WLn coupled to the other unselected pages may be set to the reference pass voltage Vpass. The reference pass voltage Vpass, the first offset pass voltage Vpass_offset1, and the second offset pass voltage Vpass_offset2 may be increased in potential level in a stepped pattern and be applied during each set flat period. For example, a potential D of the first offset pass voltage Vpass_offset1 may be lower than a potential E of the reference pass voltage Vpass. A potential F of the second offset pass voltage Vpass_offset2 may be higher than the potential E of the reference pass voltage Vpass. Furthermore, a flat period of the first offset pass voltage Vpass_offset1 may be set to a period shorter than a flat period of the reference pass voltage Vpass. A flat period of the second offset pass voltage Vpass_offset2 may be set to a period longer than the flat period of the reference pass voltage Vpass.

In the case where the pass voltages are set as illustrated in FIGS. 9 and 13, if a read voltage application operation is performed on the selected page, a self-boosting phenomenon may occur on channels of unselected memory cell strings among a plurality of memory cell strings coupled to one bit line, as illustrated in FIG. 10. In other words, the unselected memory cell strings that share the word lines with the selected memory cell strings may be self-boosted by the first offset pass voltage Vpass_offset1, the second offset pass voltage Vpass_offset2, and the reference pass voltage Vpass that are applied to the selected memory cell strings. A boosting area of the channel that corresponds to memory cells Csel−1 to C0 disposed in the second direction based on a selected memory cell Csel to which the read voltage Vread is to be applied may have a relatively high boost potential level because the length of the boosting area is shorter than that of a boosting area of the channel that corresponds to memory cells Csel+1 to Cn disposed in the first direction. Hence, an HCI phenomenon, in which hot carriers occur in a lower channel area of the selected memory cell Csel and are injected into a channel area adjacent thereto in the second direction, may be caused. To overcome the foregoing problem, if the first offset pass voltage Vpass_offset1 having the potential D lower than the potential E of the reference pass voltage Vpass and having the flat period A shorter than the flat period B of the reference pass voltage Vpass is applied to the memory cells Csel−11 and Csel−2 adjacent to the selected memory cell Csel in the second direction, the boosting potential level of the channel may descend as illustrated by the dashed line of FIG. 10. Consequently, the HCI phenomenon of the unselected memory strings during read operation may be mitigated.

Figure 14:
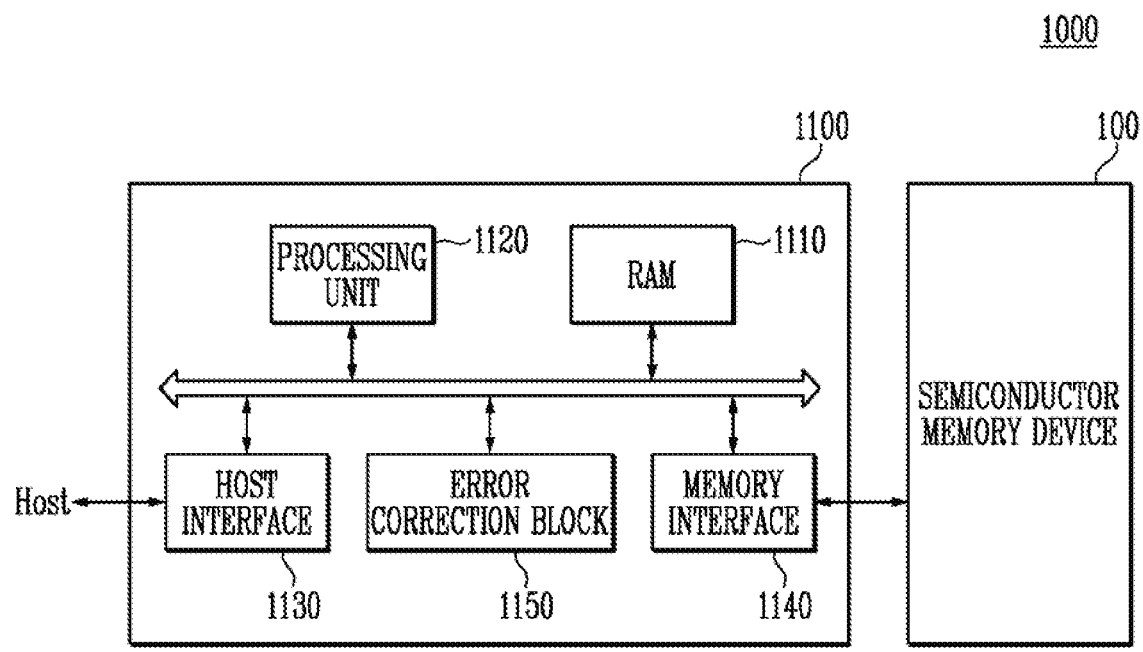
FIG. 14 is a block diagram illustrating a memory system including the semiconductor memory device of FIG. 1.

FIG. 14 is a block diagram illustrating a memory system 1000 including the semiconductor memory device of FIG. 1.

Referring to FIG. 14, the memory system 1000 may include the semiconductor memory device 100 and a controller 1100.

The semiconductor memory device 100 may have the same configuration and operation as those of the semiconductor memory devices described with reference to FIG. 1. Hereinafter, repetitive explanations will be omitted.

The controller 1100 is coupled to a host and the semiconductor memory device 100. The controller 1100 may access the semiconductor memory device 100 in response to a request from the host. For example, the controller 1100 may control a read operation, a write operation, an erase operation, and a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operating memory for the processing unit 1120, a cache memory between the semiconductor memory device 100 and the host, and a buffer memory between the semiconductor memory device 100 and the host. The processing unit 1120 may control the overall operation of the controller 1100. In addition, the controller 1100 may temporarily store program data provided from the host during the write operation.

The host interface 1130 may include a protocol for performing data exchange between the host and the controller 1100. In an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100. The processing unit 1120 may control the semiconductor memory device 100 to adjust the read voltage according to an error detection result from the error correction block 1150 and perform re-reading. In an embodiment, the error correction block 1250 may be provided as a component of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick, multimedia card (MMC, RS-MMC, or MMCmicro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data in a semiconductor memory. When the memory system 1000 is used as the SSD, the operating speed of the host coupled to the memory system 2000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 15:
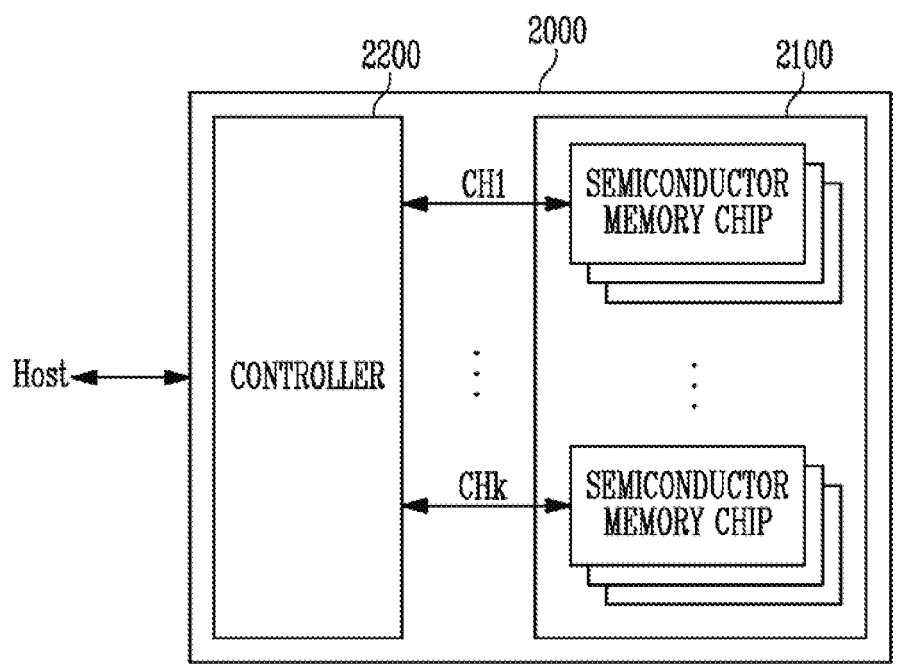
FIG. 15 is a block diagram illustrating an example of application of the memory system of FIG. 14.

FIG. 15 is a block diagram illustrating an example of application of the memory system 2000 of FIG. 14.

Referring to FIG. 15, the memory system 2000 may include the semiconductor memory device 2100 and a controller 2200. The semiconductor memory device 2100 includes a plurality of memory chips. The semiconductor memory chips may be divided into a plurality of groups.

In FIG. 15, it is illustrated that the plurality of groups respectively communicate with the controller 2200 through first to k-th channels CH1 to CHk. Each semiconductor memory chip may have the same configuration and operation as those of a component of the semiconductor memory device 100 described with reference to FIG. 1.

Each group may communicate with the controller 2200 through one common channel. The controller 2200 has the same configuration as that of the controller 1100 described with reference to FIG. 14 and is configured to control a plurality of memory chips of the semiconductor memory device 2100 through the plurality of channels CH1 to CHk.

Figure 16:
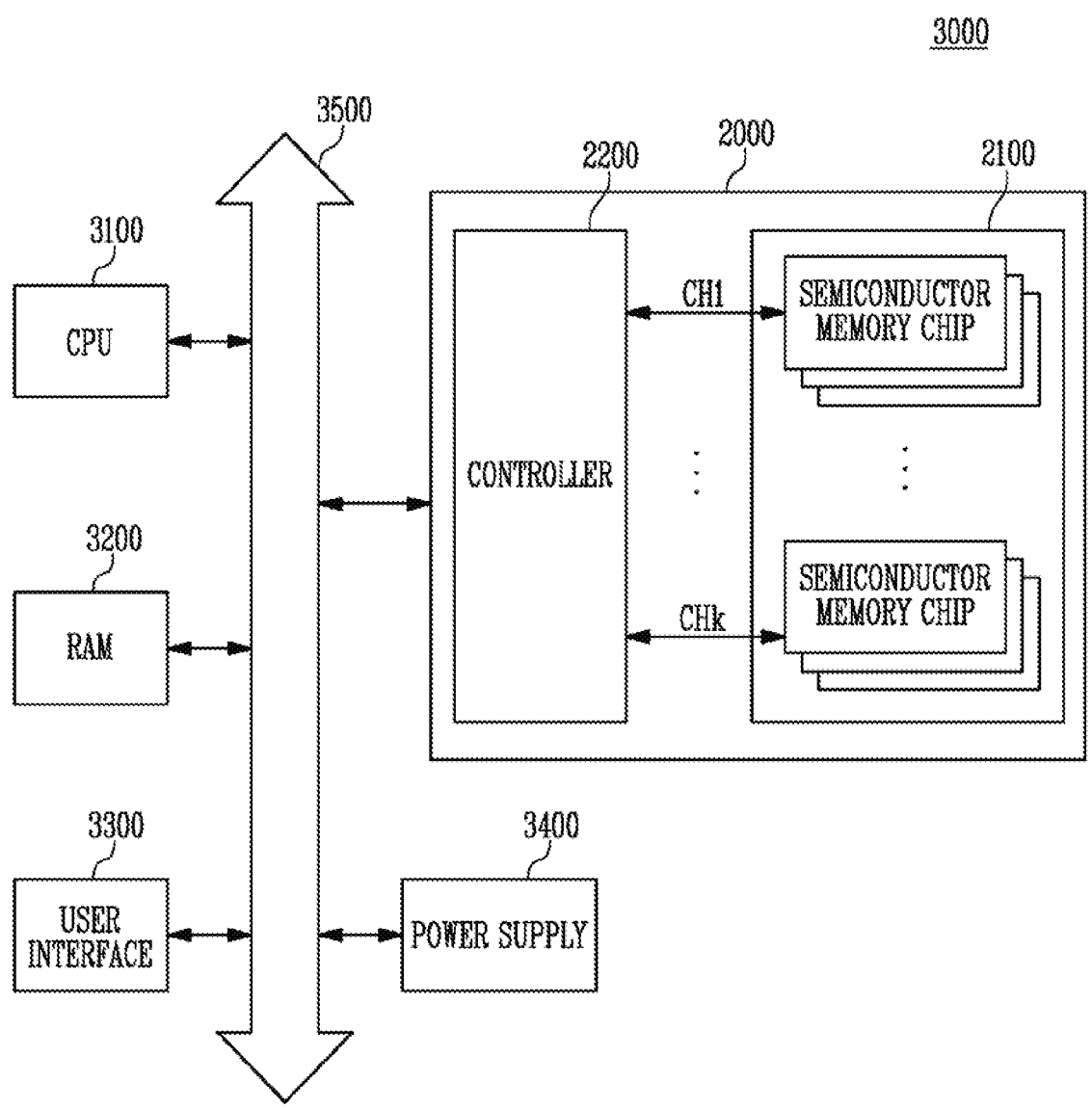
FIG. 16 is a block diagram illustrating a computing system including the memory system illustrated with reference to FIG. 15.

FIG. 16 is a block diagram illustrating a computing system 3000 including the memory system 2000 illustrated with reference to FIG. 15.

Referring to FIG. 16, the computing system 3000 includes a central processing unit 3100, a random access memory (RAM) 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 16, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 16, the memory system 2000 described with reference to FIG. 15 is illustrated as being used. However, the memory system 2000 may be replaced with the memory system 1000 described with reference to FIG. 14. In an embodiment, the computing system 3000 may include all of the memory systems 1000 and 2000 described with reference to FIGS. 15 and 14.

In various embodiments of the present disclosure, during a read operation of a semiconductor memory device, a read disturb phenomenon may be mitigated by adjusting pass voltages to be applied to pages adjacent to a selected page.

While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A semiconductor memory device comprising:
a memory block including upper pages, a center page, and lower pages;
a peripheral circuit configured to perform a read operation on the memory block; and
a control logic configured to control the peripheral circuit to perform the read operation and control the peripheral circuit such that, during the read operation, based on a location of a selected page among the plurality of pages, a pass voltage to be applied to first adjacent pages disposed adjacent to the selected page in a first direction differs from a pass voltage to be applied to second adjacent pages disposed adjacent to the selected page in a second direction.

2. The semiconductor memory device according to claim 1, wherein, when the selected page is included in the upper pages, the control logic controls the peripheral circuit to apply a first offset pass voltage to the first adjacent pages and apply a second offset pass voltage to the second adjacent pages.

3. The semiconductor memory device according to claim 2, wherein, when the selected page is included in the upper pages, the control logic controls the peripheral circuit to apply a reference pass voltage to pages other than the selected page, the first adjacent pages, and the second adjacent pages among the plurality of pages.

4. The semiconductor memory device according to claim 3, wherein the first offset pass voltage is lower than the second offset pass voltage.

5. The semiconductor memory device according to claim 4, wherein the reference pass voltage is higher than the first offset pass voltage and lower than the second offset pass voltage.

6. The semiconductor memory device according to claim 5, wherein, when the selected page is included in the lower pages, the control logic controls the peripheral circuit to apply the second offset pass voltage to the first adjacent pages and apply the first offset pass voltage to the second adjacent pages.

7. The semiconductor memory device according to claim 6, wherein, when the selected page is included in the lower pages, the control logic controls the peripheral circuit to apply the reference pass voltage to pages other than the selected page, the first adjacent pages, and the second adjacent pages among the plurality of pages.

8. The semiconductor memory device according to claim 5, wherein, when the selected page is included in the center page, the control logic controls the peripheral circuit to apply the reference pass voltage to unselected pages other than the selected page among the plurality of pages.

9. The semiconductor memory device according to claim 1,
wherein the memory block includes a plurality of memory cell strings disposed between a source line and bit lines, and
wherein the upper pages correspond to memory cells included in an upper end of the memory cell strings included in the memory block, the center page corresponds to memory cells included in a central portion of the memory cell strings, and the lower pages correspond to memory cells included in a lower end of the memory cell strings.

10. The semiconductor memory device according to claim 9, wherein the first direction corresponds to a direction toward the bit lines, and the second direction corresponds to a direction toward the source line.

11. A semiconductor memory device comprising:
a memory block including a plurality of pages;
a peripheral circuit configured to perform a read operation on the memory block; and
a control logic configured to control the peripheral circuit to perform the read operation, wherein during the read operation, when a selected page of the plurality of pages corresponds to an upper end of a memory cell string, the control logic sets, to a first offset pass voltage, a pass voltage to be applied to first adjacent pages disposed adjacent to the selected page in a first direction, and sets, to a second offset pass voltage higher than the first offset pass voltage, a pass voltage to be applied to second adjacent pages disposed adjacent to the selected page in a second direction.

12. The semiconductor memory device according to claim 11, wherein, when the selected page corresponds to a lower end of the memory cell string, the control logic sets the pass voltage to be applied to the first adjacent pages to the second offset pass voltage and sets the pass voltage to be applied to the second adjacent pages to the first offset pass voltage.

13. The semiconductor memory device according to claim 11, wherein, when the selected page corresponds to a central portion of the memory cell string, the control logic sets the pass voltage to be applied to the first adjacent pages and the pass voltage to be applied to the second adjacent pages to a reference pass voltage higher than the first offset pass voltage and lower than the second offset pass voltage.

14. The semiconductor memory device according to claim 11, wherein the first direction corresponds to a direction from the selected page toward a bit line, and the second direction corresponds to a direction from the selected page toward a source line.

15. A method of operating a semiconductor memory device, comprising:
- setting a first pass voltage corresponding to first adjacent pages disposed adjacent to a selected page in a first direction during a read operation on a memory block including a plurality of pages;
- setting a second pass voltage corresponding to second adjacent pages disposed adjacent to the selected page in a second direction; and
- applying a read voltage to the selected page, and applying the first pass voltage and the second pass voltage to the first adjacent pages and the second adjacent pages, respectively,
- wherein in setting the first pass voltage and the second pass voltage, a voltage value of the first pass voltage and a voltage value of the second pass voltage vary depending on a location of the selected page.

16. The method according to claim 15,
wherein the plurality of pages are divided into upper pages, a center page, and lower pages, and
wherein, when the selected page is included in the upper pages, the first pass voltage is set to a first offset pass voltage, and the second pass voltage is set to a second offset pass voltage higher than the first offset pass voltage.

17. The method according to claim 16, wherein, when the selected page is included in the lower pages, the first pass voltage is set to second offset pass voltage, and the second pass voltage is set to the first offset pass voltage.

18. The method according to claim 16, wherein, when the selected page is included in the center page, the first pass voltage and the second pass voltage are set to a reference pass voltage higher than the first offset pass voltage and lower than the second offset pass voltage.

19. The method according to claim 16,
wherein the memory block includes a plurality of memory cell strings disposed between a source line and bit lines, and
wherein the upper pages correspond to memory cells included in an upper end of the memory cell strings included in the memory block, the center page corresponds to memory cells included in a central portion of the memory cell strings, and the lower pages correspond to memory cells included in a lower end of the memory cell strings.

20. The method according to claim 19, wherein the first direction corresponds to a direction toward the bit lines, and the second direction corresponds to a direction toward the source line.

* * * * *